United States Patent [19]
Koerber et al.

[11] Patent Number: 6,094,353
[45] Date of Patent: Jul. 25, 2000

[54] FRONT SYSTEM FOR PRINTED CIRCUIT BOARDS IN MOUNTING RACKS HAVING A LATCHABLE LEVER PULL HANDLE

[75] Inventors: Werner Koerber, Betzenstein; Ernst Billenstein, Burgbernheim; Kurt-Michael Schaffer, Eckental, all of Germany

[73] Assignee: Siemens Aktiengesellschaft, Munich, Germany

[21] Appl. No.: 09/365,778

[22] Filed: Aug. 3, 1999

Related U.S. Application Data

[63] Continuation of application No. PCT/DE97/00212, Feb. 3, 1997.

[51] Int. Cl.[7] .............................. H05K 5/00; H05K 7/12
[52] U.S. Cl. .......................... 361/754; 361/798; 361/759; 361/801
[58] Field of Search .................................. 361/726, 728, 361/740, 753, 754, 759, 797, 798, 801, 802; 211/41.17; 248/560; 439/157; 403/321, 325

[56] References Cited

U.S. PATENT DOCUMENTS

| | | |
|---|---|---|
| 4,233,646 | 11/1980 | Leung et al. . |
| 5,414,594 | 5/1995 | Hristake . |
| 5,504,656 | 4/1996 | Joist ........................................ 361/752 |
| 5,751,551 | 5/1998 | Hileman et al. ......................... 361/753 |
| 5,801,926 | 9/1998 | Cutsforth et al. ....................... 361/754 |

FOREIGN PATENT DOCUMENTS

| | | |
|---|---|---|
| 0129883 | 1/1985 | European Pat. Off. . |
| 0194515 | 9/1986 | European Pat. Off. . |

*Primary Examiner*—Jayprakash N. Gandhi
*Attorney, Agent, or Firm*—Sughrue, Mion, Zinn, Macpeak & Seas, PLLC

[57] ABSTRACT

The front system contains one lever pull handle (1) preferably both at the upper and the lower corner of the front element (38, 11). A latching slide (10) is mounted in each of these lever pull handles (1). Furthermore, a latching mechanism (22, 23, 26) is provided, which engages on the latching slide, as well as on a stressing mechanism (35) and on the front element (38, 11) such that the lever pull handle is held resting against the front element (38, 11) in a locked position. The latching mechanism can be unlocked again by a movement of the latching slide which is exerted on a pushing region (27) of the latching slide and is directed in a direction opposite to the pre-stress (52, 53) of the stressing mechanism.

17 Claims, 6 Drawing Sheets

FRONT SYSTEM FOR PRINTED CIRCUIT BOARDS IN MOUNTING RACKS HAVING A LATCHABLE LEVER PULL HANDLE

This is a Continuation of International Application PCT/DE97/00212, with an international filing date of Feb. 3, 1997, the disclosure of which is incorporated into this application by reference.

FIELD OF AND BACKGROUND OF THE INVENTION

The invention relates to new and useful improvements in front systems for electrical printed circuit boards. More particularly, the invention relates to improvements in arrangements used for levering such front systems into and out of mounting racks.

U.S. Pat. No. 4,233,646 discloses a lever pull handle for printed circuit boards. There is an engagement region fashioned as an open-ended wrench in the region of a lower fulcrum. When the lever is operated, a printed circuit board can be levered into or out of a mounting rack via this engagement region. Above the fulcrum, the handle has an elongated lever region, which ends in a handle piece. There is a region in the form of a hook at the junction between the lever region and the handle piece. This allows the lever to be locked on a pin which is arranged on the printed circuit board, so that the lever pull handle rests approximately parallel to and against the front edge of the printed circuit board.

Such an arrangement has the following disadvantage. If, for example, the printed circuit board is in a state where it is completely inserted into the mounting rack and if, for example, the intention is to lever it out of the mounting rack, then an operator must initially exert force to move the lever out of the locked position. As a result, the region formed as a hook is separated from the pin, thereby allowing the lever to be pivoted about the fulcrum such that the engagement region can come into contact with the mounting rack. Only then is it possible for an operator to exert further force on the handle piece to lever the assembly out of the mounting rack. In the process, the problem arises that an operator cannot reliably distinguish between the two successive processes of applying force. In fact, there is a risk that the unlocking of the lever pull handle by the first process of applying force will merge directly into the process of levering the entire printed circuit board out of the mounting rack. In practice, this is increasingly undesirable. While the unlocking of the lever pull handle from the locked position represents a simple preparatory action, the process of completely levering a printed circuit board out of a mounting rack is a drastic action when such a printed circuit board is part of an overall electrical system which, in many cases, comprises a large number of printed circuit boards. In order to prepare for this, an operator must in some circumstances carry out other, different measures, for example in the simplest case disconnecting the power supplies. For this reason, an inadvertent, virtually smooth transition between the simple unlocking of a lever pull handle on the front face of a printed circuit board and the actual process of levering the printed circuit board out of the mounting rack is undesirable, for example for safety reasons.

European Patent EP 0 129 883 B1 discloses a further version of a lever pull handle, which corresponds to the type disclosed in U.S. Pat. No. 4,233,646. In this case, a leaf spring projects from the front face of the handle piece of the angled lever. This leaf spring is directed toward the front strip of the printed circuit board assembly, and is fitted at the end thereof with a latching tab. This latching tab can be latched in a window-like opening in the front strip in order to lock the lever. In order to unlock the lever from this locked position, an operator must push the leaf spring in by exerting force on the handle piece, and must at the same time pivot the lever. This can be done only by exerting considerable force. As a result, the problem that has already been described with respect to U.S. Pat. No. 4,233,646 also occurs here, namely the lack of any distinction between the preparatory process of unlocking the lever and the main process of levering the entire printed circuit board out.

European Patent EP 0 194 515 B1 discloses a further version of a lever pull handle which likewise, in principle, corresponds to the design described in U.S. Pat. No. 4,233, 616 and EP 0 129 883 B1. Once again, the lever can be locked via a latching tab on a leaf spring in a position which rests as far as possible against the surface of the front panel of a printed circuit board assembly. A spiral spring is mounted in the interior of the lever pull handle. This spiral spring exerts a pre-stress on the entire lever, which is mounted such that it can rotate, such that the lever pivots as far as possible in the direction of the locked position, and/or snaps back on its own toward this position. The disclosures of U.S. Pat. No. 4,233,646, EP 129 883 B1 and EP 0 194 515 B1 are incorporated into he present application by reference.

OBJECTS OF THE INVENTION

Accordingly, it is a primary object of the invention to provide a front system in which, on the one hand, the associated lever pull handles can be operated more easily. A further object is providing a front system for which the operations of unlocking the lever and levering out the printed circuit board are better separated from one another.

SUMMARY OF THE INVENTION

These and other objects are achieved by a front system, which, according to one formulation of the invention, is supported in a mounting rack via opposing pairs of adjacently arranged guide rails, and in which:

a) a front element is fitted on a front end face of an electrical printed circuit board;

b) lever pull handles are fitted respectively to an upper corner and to a lower corner of the front element, each of the lever pull handles being mounted pivotably about a fulcrum in a plane of the printed circuit board and having an engagement region on an end facing a respective corner of the front element, wherein the engagement region is supported on the mounting rack when the printed circuit board is levered into or out of the mounting rack;

c) a latching slide is mounted in each of the lever pull handles, each of the latching slides having a pushing region at an end of the respective lever pull handle that is located opposite the engagement region;

d) stressing mechanisms each, respectively, exert a pre-stress, directed toward the pushing region, on the latching slide and hold the latching slide in an original position; and e) latching mechanisms are arranged at the upper corner and the lower corner, respectively, of the front element, each of the latching mechanisms engaging on the latching slide, the stressing mechanism and the front element. The lever pull handles are held in locked positions when each lever pull handle is pivoted toward the front element of the printed circuit board. The latching mechanisms are each unlocked by a force on the latching slide which is exerted on the pushing region of the latching slide and is directed in a direction opposing the pre-stress of said stressing mechanism. Variations and specific advantageous embodiments of the invention are disclosed and claimed as well.

BRIEF DESCRIPTION OF THE DRAWINGS

The invention will be explained in more detail with reference to preferred embodiments, which are illustrated in the figures that are described briefly below, wherein.

DETAILED DESCRIPTION OF THE PREFERRED EMBODIMENTS

Figure 1:
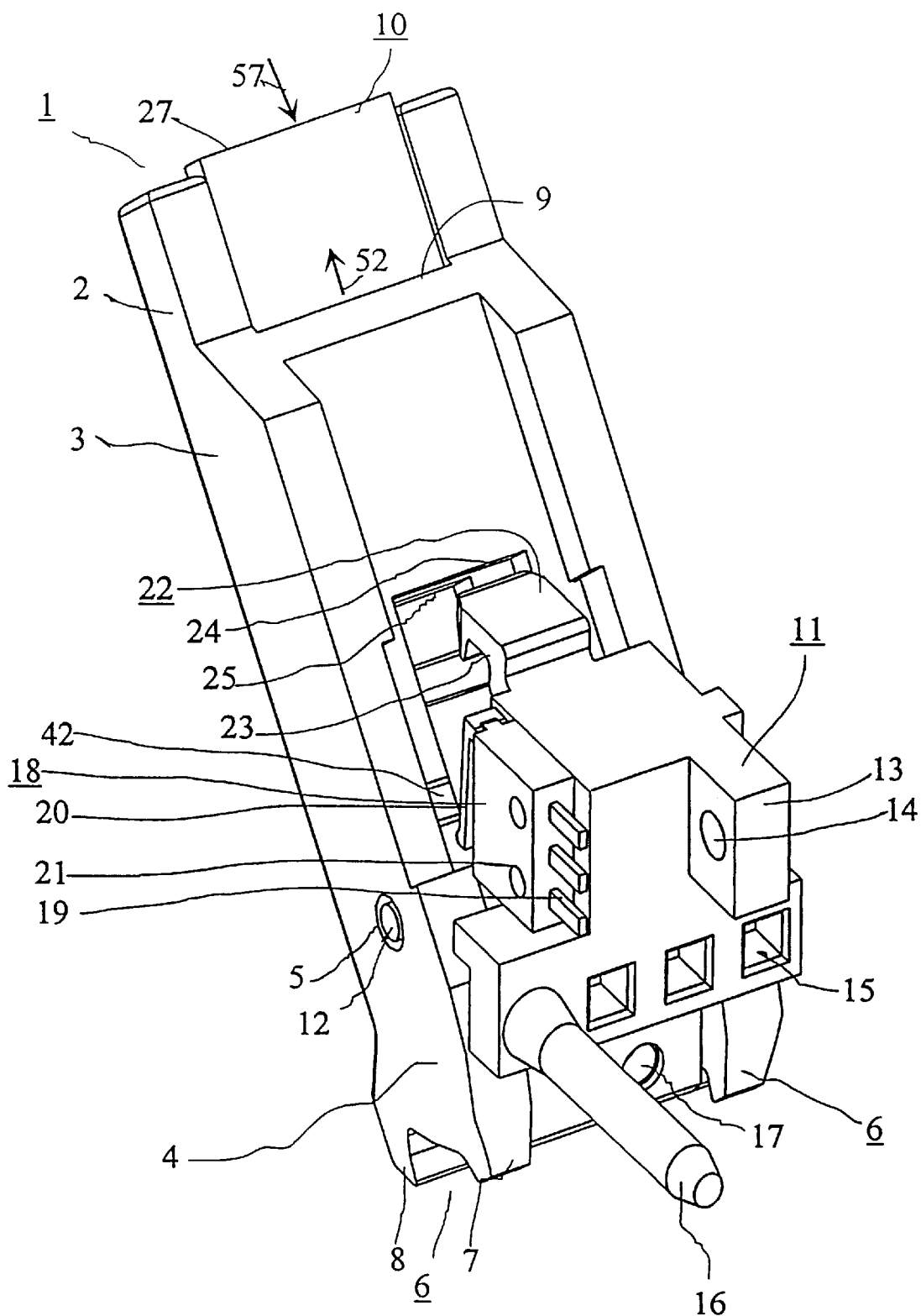
FIG. 1 shows a perspective view of the rear side of a preferred embodiment of the front system according to the invention, in which a lever pull handle is advantageously fitted on a lower or upper end piece of a front element.

The perspective view illustrated in FIG. 1 shows the rear side of a preferred embodiment of a front system designed according to the invention. The lever pull handle 1 of this front system has an elongated, first lever arm 3, which extends from the handle region 2 of the lever pull handle 1 to a through-hole 5. A bearing stud 12 passes through the through-hole 5 and is used as a fulcrum for the lever pull handle 1. Finally, a second, short lever arm 4 extends from the through-hole 5 and ends in an engagement region 6 which is preferably shaped as an open-jawed wrench. This engagement region 6 has at least one so-called levering-in edge 7 and at least one levering-out edge 8. These edges are supported on the mounting rack when the lever pull handle 1 is pivoted about the fulcrum 12 in the direction of the mounting rack, causing an assembly to be levered in, and when the lever pull handle 1 is pivoted about the fulcrum 12 away from the mounting rack, causing an assembly to be levered out. The levering-in edge 7 and levering-out edge 8 of the engagement region 6 are preferably supported on an upper and a lower transverse rail, respectively, of the mounting rack. FIGS. 4 to 7 show, by way of example, a cross section of a lower transverse rail 39 of a mounting rack 55. This transverse rail has a projecting supporting strip 40, which is provided with a row of engagement openings 41 in the transverse direction.

When a printed circuit board is levered into the mounting rack, the levering-in edge 7 is supported on an inner flank of the physically associated engagement opening 41. This is shown in the example in FIG. 5, which shows the state when a printed circuit board 37 is levered completely into the mounting rack. In this case, strip connectors on the printed circuit board 37, which are not illustrated, make electrical contact with corresponding, mating strip connectors which are arranged in the interior of the mounting rack. On the other hand, the levering-out edge 8 is supported on the outer end face of the supporting strip 40 when the printed circuit board is levered out of the mounting rack. Such a state is illustrated in the example in FIG. 6, which shows the start of the process of levering the printed circuit board 37 out of the mounting rack 55. Here, force is applied to the upper handle region 2 of the lever pull handle 1 in order to pivot the handle away from the end face 56 of the printed circuit board 37.

As illustrated in FIG. 1, the e.g. lower lever pull handle 1 of the front system of an assembly is preferably rotatably mounted on a so-called front element of the front system. The front element is in turn fitted on the front end face 56 of a printed circuit board 37. A front element preferably includes a so-called front panel 38, which covers the end face 56 of the printed circuit board 37 and which is illustrated in the section illustrations in FIGS. 4 to 7. Furthermore, a front element preferably has one end piece, fitted to each of the lower and upper ends of the front panel 38, and via which the front panel 38 is connected to the printed circuit board 37. The views shown in the figures each illustrate a lower end piece 11, by way of example. According to the illustration in FIG. 1, such an end piece 11 advantageously has a projecting retaining block 13 with a hole 14 via which the retaining block 11 can be attached to the lower edge of a printed circuit board.

Furthermore, there is preferably a guide pin 16 on an end face of the retaining block pointing in the direction of the mounting rack. Generally, even at the start of a process of levering a printed circuit board in, this guide pin 16 is inserted into a corresponding opening in the mounting rack, and prevents the printed circuit board from escaping sideways. Furthermore, there are coding chambers 15 on this end face of the retaining block 11, into which coding pins can be inserted. Finally, the retaining block 11 can be firmly locked to the mounting rack in the completely inserted state, via a retaining screw which passes through the hole 17. Another retaining block, which corresponds to the retaining block 11 illustrated in FIG. 1, is fitted to the upper end (which, in order to improve clarity, is not shown in FIG. 1) of a printed circuit board. As already shown in FIG. 1, the lower lever pull handle 1, by way of example, of a front system is preferably mounted directly on the corresponding end piece 11, via a bearing stud 12, such that it can pivot. FIG. 1 shows a perspective rear view of the lever pull handle 1 and of the associated end piece 11, with the lever pull handle 1 being located in a pivoted-out position. In order again to improve clarity, the associated printed circuit board and the front panel of the front element are not shown in this particular figure.

According to the invention, a latching slide 10 is mounted in the lever pull handle 1. This latching slide 10 has a pushing region 27 which is preferably in the form of an edge and is accessible for operation by a person at that end of the lever pull handle 1 which forms the handle region 2, opposite the engagement region 6. The latching slide 10 is preferably mounted in a guide channel 9 in the interior of the lever pull handle 1. In the embodiment shown in FIG. 1, the handle region 2 of the lever pull handle 1 is more shallow than the region of the long lever arm 3. This makes it easier for somebody to operate the handle region. In such a case, it is advantageous if the guide channel 9 for the latching slide 10 runs only in the region of the long lever arm 3. The end which forms the pushing region 27 of the latching slide 10 is then freely accessible in the handle region 2 of the lever pull handle 1 and is thus easily accessible by an operator, using, for example, his index finger.

The front system according to the invention contains so-called stressing mechanisms. Each of these stressing mechanisms exerts a pre-stress, directed toward the pushing region 27, on the latching slide 10, so that the slide 10 is held in the original position shown in FIG. 1. The direction of the pre-stress is indicated in FIG. 1 by means of a pushing direction arrow 52. The latching slide can be moved out of this original position by a pushing force exerted, for example, with a finger on the pushing edge 27, in the direction of the other pushing direction arrow 57. In this way, an associated latching mechanism can be unlocked. This will be described in more detail in the following text.

Figure 4:
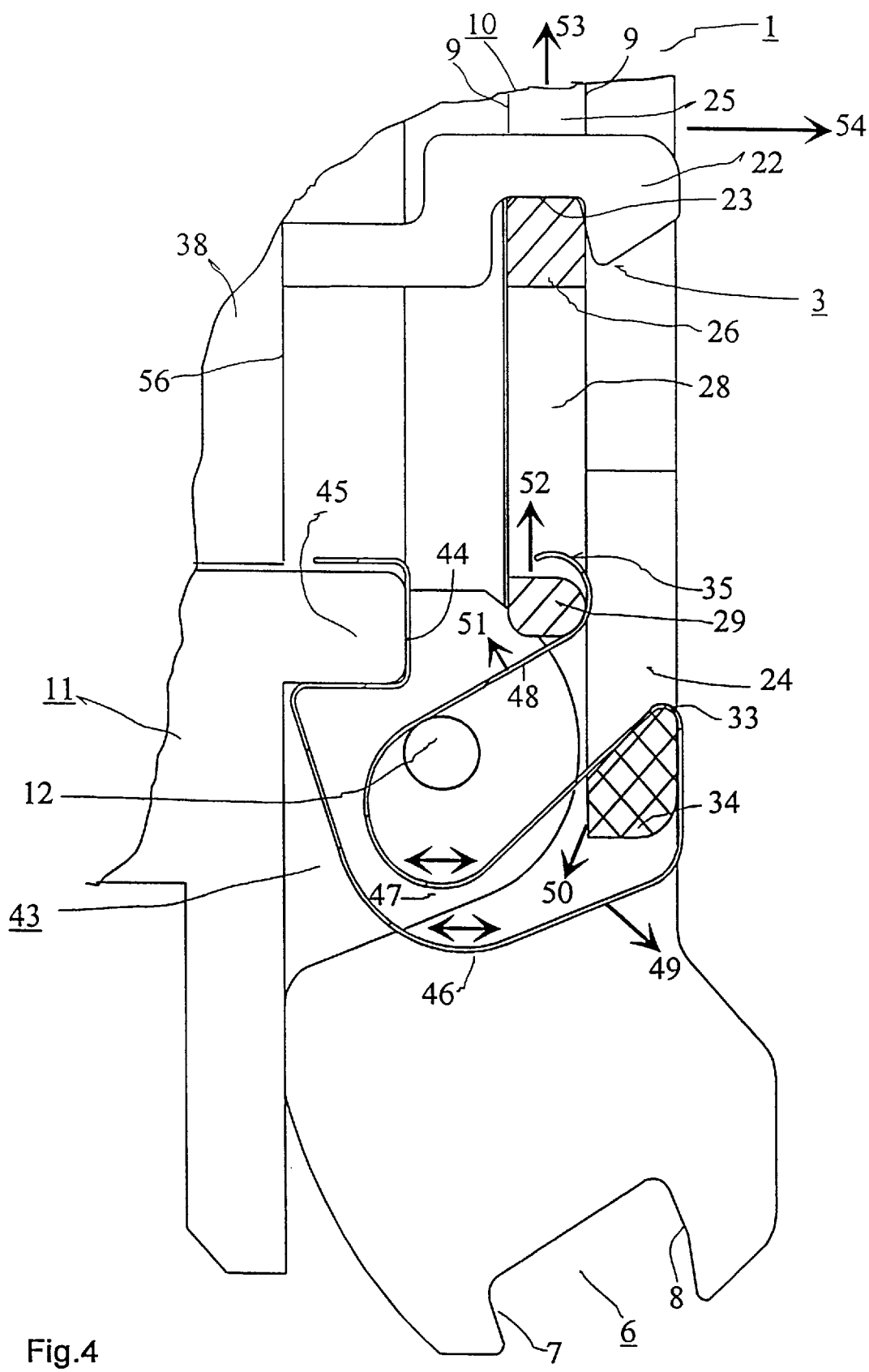
FIG. 4 shows an illustration of a detail through a part of a lever pull handle corresponding to the embodiments in the preceding figures, and showing the details of a preferred embodiment of a spiral spring of the stressing mechanism of the front system.
Figure 5:
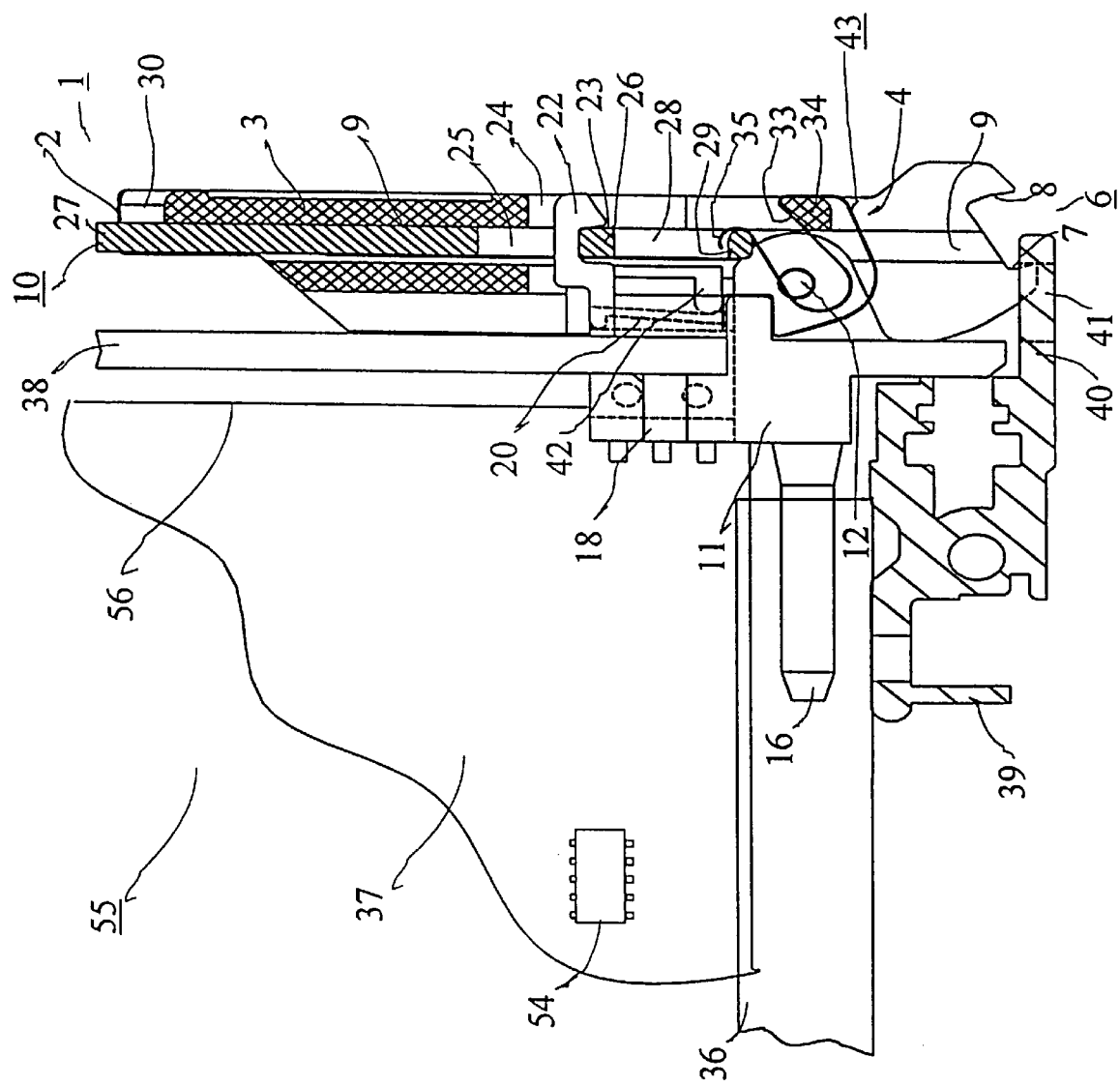
FIG. 5 shows a section illustration through a lever pull handle which is fitted to the lower end of the front system of a printed circuit board, in which the lever pull handle is in a locked position and the printed circuit board is in the state where it is completely inserted into the mounting rack.

According to the invention, latching mechanisms are furthermore provided, which are arranged at the upper corner and lower corner of the front element. When the lever pull handle 1 is pivoted toward the front element of the printed circuit board 37, the associated latching mechanism engages with the latching slide 10, the stressing mechanism and the front element such that the lever pull handle 1 is held in a locked position, resting as far as possible against the front element. Such a locked position is illustrated, by way of example, in FIGS. 4 and 5. On the other hand, as already described, the latching mechanism can be unlocked again by a movement of the latching slide 10 which is exerted on the pushing region 27 of the latching slide 10 of the lever pull handle 1 and is directed in the direction 57, opposite to the pre-stress 52 of the stressing mechanism. In the example of FIGS. 1, 4 and 5, to do this, an operator must push the latching slide 10 downward into the guide channel 9, and thus into the long lever arm 3.

Figure 6:
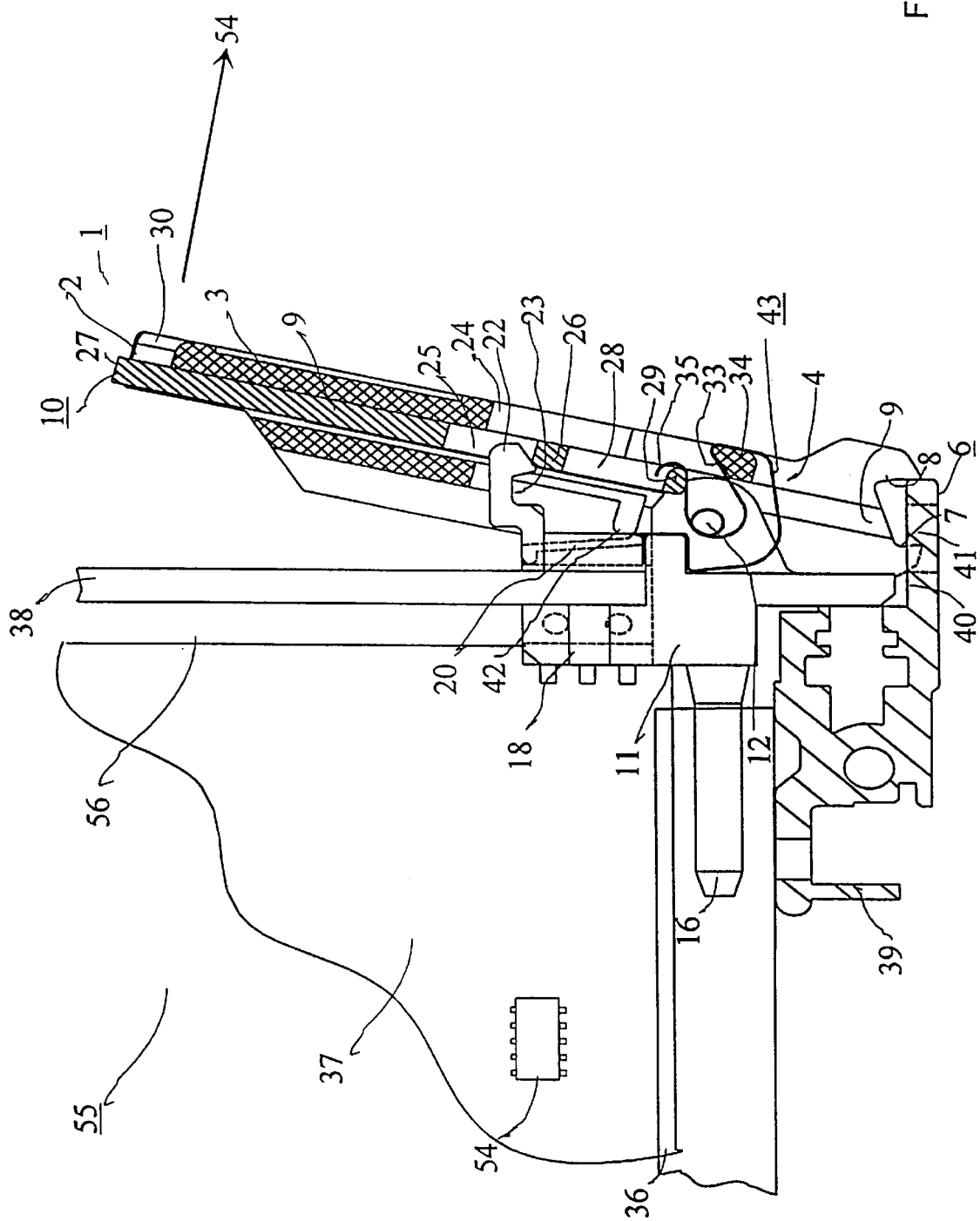
FIG. 6 shows a section illustration through a lever pull handle as shown in FIG. 5, which is fitted to the lower end of the front system of a printed circuit board, and in which the lever pull handle is in an unlocked position, such that the printed circuit board is in a state where it is still completely inserted in the mounting rack.

The front system according to the invention has the advantage that the associated lever pull handle can be operated by an operator without applying a large amount of force and in an ergonomically advantageous manner. In particular, the lever pull handle can be unlocked, that is to say its latching mechanism released, in a simple manner. In terms of the force, this unlocking process is thus virtually completely separated from the other process of completely levering the printed circuit board out of the mounting rack. While somebody can unlock the lever pull handle by operating the pushing edge of the latching slide using a finger, this person has to apply a considerably greater force to the lever arm in order to lever out the printed circuit board. To do this, it is generally necessary for this person to use a number of fingers or the entire hand to completely grip the handle region 2 of the unlocked lever pull handle which, in this state and as illustrated in FIG. 6, is advantageously already located in a position pivoted slightly away from the front panel. The lever pull handle therefore has to be gripped in two different ways in order to unlock the lever pull handle and to lever a printed circuit board out completely. An inadvertent, smooth transition between the preparatory lever unlocking and the actual process of levering a printed circuit board out is thus rendered virtually impossible.

These characteristics of the front system according to the invention are further assisted if, according to a further embodiment of the invention also incorporated into FIGS. 1 to 7, the lever pull handle 1 is designed in an extended form such that, when the latching mechanism is in the locked position, the lever pull handle 1 runs approximately parallel to the front element of the printed circuit board and thereby rests as flatly as possible against the printed circuit board. It is particularly advantageous if the handle region 2 at the head end of the lever pull handle 1, the long lever arm 3, the short lever arm 4 and the engagement region 6 at the foot end of the lever pull handle lie roughly in a plane. In such a situation, the lever pull handle has essentially no or actually no projections whatsoever and, in the latched position, rests virtually completely flat against the front panel of the front element of a printed circuit board. The latching slide 10 is then advantageously mounted in the first, long lever arm 3, which extends in a straight line. Further, the unlocking forces, which are applied to the end of the lever pull handle 1 on the pushing region 27 of the latching slide 10 and in the direction of the arrow 57, run virtually completely along the axis of the lever pull handle and essentially parallel to the front element of the printed circuit board. These forces are thus separated from the forces which have to be exerted to lever a printed circuit board out by pivoting the lever pull handle away from the front panel.

According to a further embodiment, the latching mechanism advantageously has a latching hook 22, which is designed in such a manner that the pre-stress 52 that is exerted by the stressing mechanism on the latching slide 10 results in the latching slide 10 and the front element engaging with one another, thereby causing the lever pull handle 1 to be held in the locked position.

In the preferred embodiment of the invention illustrated in the figures, the latching mechanism, in particular in the form of a latching hook 22, is connected directly to the end piece 11 at the respective end of the front panel 38. Thus, for example, in the illustration in FIG. 1, a latching hook 22 projects from the body of the end piece 11 in the direction of the pivotably mounted lever pull handle 1. The latching groove 23 of this latching hook 22 points downwards and, when the lever pull handle 1 is in the vertical state, engages with the latching slide 10 in such a manner that the pre-stress which is directed toward the latching slide 10 in the direction of the pushing arrow 52 results in the latching slide 10 resting securely in the latching groove 23 of the latching hook 22. In this way, the lever pull handle can be held virtually vertically in the locked position, and resting as far as possible against the end edge of the printed circuit board. The coupling between the hook 22 and the slide 10 can be released again by a pushing force exerted on the latching slide 10, in the direction of the pushing arrow 57. In the process, the latching slide 10 is released from the latching groove of the latching hook, allowing the lever pull handle to be pivoted forward out of the locked position.

Figure 3:
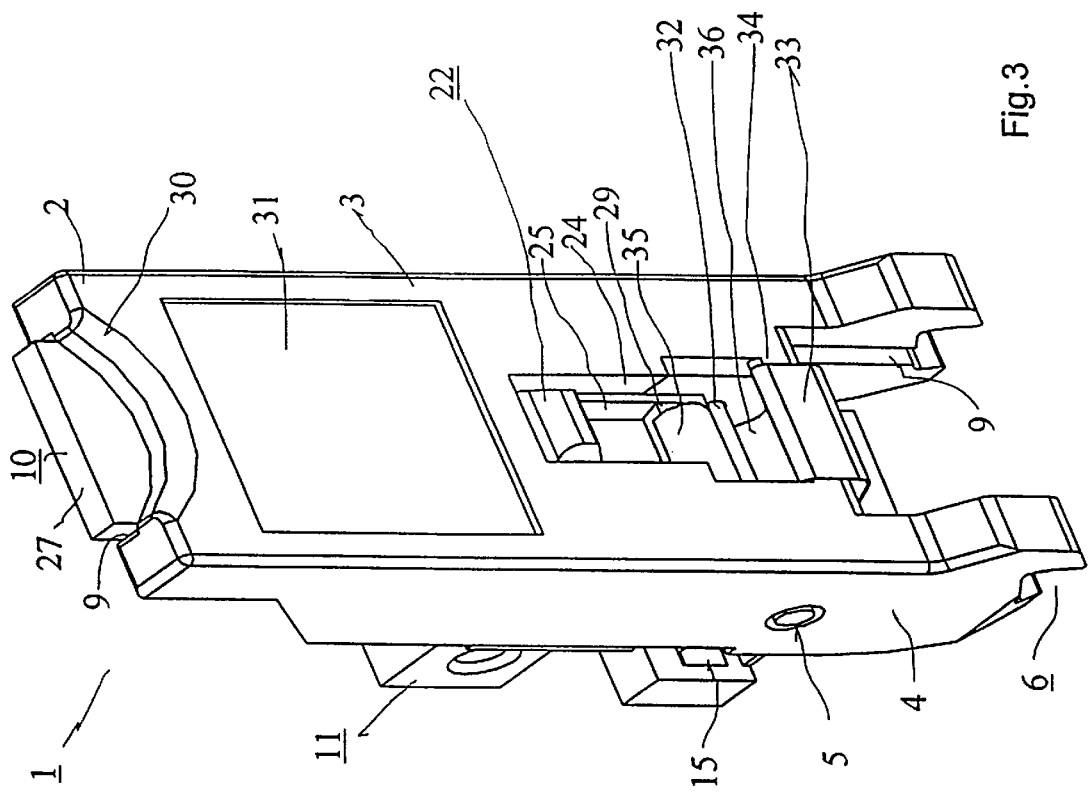
FIG. 3 shows a perspective front view of the preferred embodiment of the lever pull handle of the front system according to the invention shown in FIG. 1.

FIG. 3 shows a perspective side view of a preferred embodiment of a latching slide 10 mounted in a lever pull handle. In this case, the latching slide is roughly in the form of a flat, extended plate (see FIG. 2). The latching slide 10 advantageously also has at least one through-opening 25. A wall region 26 formed by the through-opening 25 engages the downwardly pointing hook 22 of the latching mechanism and is held in place by the pre-stress from the stressing mechanism in the direction of the pushing arrow 52 on the latching slide. The side wall 26 of the through-opening 25 is thereby pushed into the latching groove 23 such that the lever pull handle is held approximately vertically in the latched position. This can be seen in the section illustrations in FIGS. 4 and 5.

Figure 2:
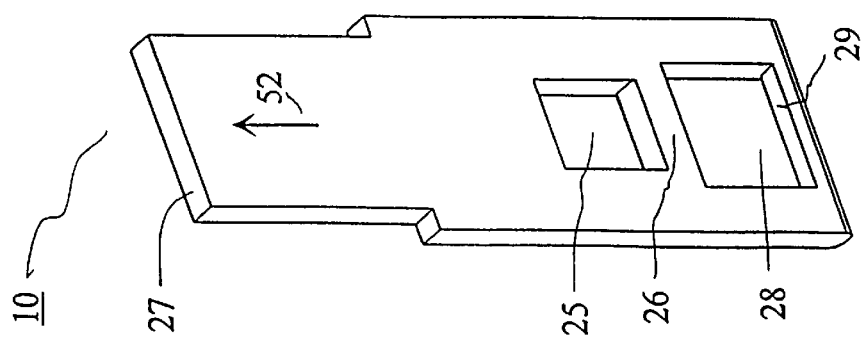
FIG. 2 shows a perspective side view of a preferred embodiment of a latching slide configured to be mounted in a lever pull handle.

It is advantageous if, as shown in the illustration in FIG. 2, the latching slide 10 has a second through-opening 28, which is bounded by a lower retaining web 29. The stressing mechanism can act on the latching slide 10 in a simple manner by means of this through-opening 28, and exert the pre-stress (oriented in the direction of the arrow 52) on the latching slide. It is particularly advantageous if the stressing mechanism have a spiral spring 43. One preferred embodiment of such a spiral spring is explained in more detail in the following text, with reference to FIGS. 4 to 7. Such a spiral spring advantageously has at least one first stressing curve 47, by means of which it is possible to exert the pre-stress 52 in the direction of the pushing region 27 of the latching slide 10. In this case, the first stressing curve 47 is supported, on the one hand, on the front element, while a pushing loop 35 at the end of the spring body acts, in particular such that it pushes on the second retaining web 29 located at the lower edge of the second through-opening 28 of the latching slide 10.

This can be seen in the perspective front view, illustrated in FIG. 3, of the preferred embodiment (corresponding to FIG. 1) of the lever pull handle of the front system according to the invention. The latching slide 10 is located in the guide channel 9 and is pushed upward, in the direction of the handle region 2 of the lever pull handle 1, by the pushing loop 35 of the stressing mechanism, which preferably is in the form of a spiral spring. Preferably, the pushing loop 35 surrounds the web 29 at the lower end of the through-opening 28. In order to simplify the actions of both the preferably hook-shaped latching mechanism 22 and the stressing mechanism 43, preferably fashioned as a spiral spring, the body of the lever pull handle 1 has, particularly in the region of its long limb 3, a through-opening in the front face thereof, as can be seen in FIG. 3.

The embodiment of the lever pull handle 1 of the front system according to the invention as illustrated in FIG. 3 also has a preferably half-moon shaped handle recess 30 at that end which is used as the handle region 2. This has the advantage that it is particularly easy for an operator's finger to reach the pushing edge 27 of the latching slide 10, and that it is possible to apply, without any problems, a pushing force in the downward direction to unlock the lever pull handle. Finally, an inscription area 31 can be applied to the front face of the long lever arm 3. Since the lever pull handle 1 is vertical when it is in the locked position, any inscription located in the inscription area 31 is easy to read at all times. Furthermore, a large inscription area is available owing to the fact that the lever pull handle 10 is preferably elongated in the lengthwise direction.

The detailed illustration in FIG. 4 through a part of the lever pull handle corresponding to the embodiments in the previous figures will be used in the following text to explain in more detail a preferred embodiment of a spiral spring for the stressing mechanism of the front system. As already explained, the spiral spring 43 has at least one stressing curve 47, which exerts a stressing force in the direction of the double arrow shown in FIG. 4. One end of the spiral spring 43 is advantageously designed in the form of a U-shaped retaining eye 44. The spiral spring is supported on the front element by clipping the U-shaped retaining eye 44 around a projecting retaining strip 45 on the end piece 11. The other end of the spiral spring 43 is advantageously in the already-described form of a pushing loop 35. This loop 35 advantageously engages in the second through-opening 28 at the foot end of the latching slide 10 and exerts a pre-stress (oriented in the direction of the pushing arrow 52) against the second retaining web 29 at the lower end of the through-opening 28. This results in the latching slide being pre-stressed in the upward direction 53 toward the handle region of the lever pull handle.

As also shown in FIG. 4, the spiral spring 43 may advantageously have a second stressing curve 46, which is connected to the first stressing curve 47. In consequence, it is possible to exert a further pre-stress on the lever pull handle 1 in the direction of the further double arrow shown in FIG. 4, with this pre-stress being directed in such a manner that, when the lever pull handle 1 is in the unlocked state, it is pivoted away from the front element. If the latching slide 10 is then pushed downward in the opposite direction to the arrows 52, 53, then the retaining web 26 emerges from the latching groove 23, and the lever pull handle 1 can pivot away from the front panel 38 on its own, in the direction of the arrow 54, without being impeded by the latching hook 22. This process of automatically pivoting away is brought about by the second stressing curve 46 in the spiral spring 43. In order to achieve a type of decoupling between the actions of the first stressing curve and the second stressing curve, the stressing spring is looped around the bearing stud 12, in a region located roughly between the stressing curves. Supporting the spring center on the bearing stud 12 results in two effects, whereby the pre-stress caused by the first stressing curve 46 essentially produces a sliding action on the latching slide 10, while the pre-stress caused by the second stressing curve 46 essentially causes the lever pull handle 1 to rotate.

In the embodiment of FIG. 4, the spring body has a U-shaped push-off loop 33 between the first and second stressing curves 47, 46. This push-off loop 33 engages on the unlocked lever pull handle such that a rotary movement about the bearing stud 12 (which acts as a fulcrum) is exerted on the lever pull handle in the direction of the arrows 49, 50. The long lever arm 3 and, in particular, the handle region 2 (not shown in FIG. 4) thus automatically pivot in the direction of the arrow 54. The U-shaped push-off loop 33 of the spiral spring 43 advantageously engages around a second retaining web 34, which bounds the through-opening 24 in the front of the lever pull handle at the bottom.

In a further embodiment of the invention, which has already been illustrated in FIG. 1, an electrical switching element 18 is also integrated into or onto the front element of the front system, in such a manner that this switching element 18 is in one switched state while the latching mechanism is in the locked state, and is in the other switched state when the latching mechanism is in the unlocked state. The integrated switching element 18 in FIG. 1 is preferably in the form of a microswitch. This can advantageously be fitted on the lower end piece 11 of the front element by means of mounting screws (which are not illustrated) through holes 21. A switching bracket 20 is preferably operated via a projecting switching contact 42, arranged on the inside of the long lever arm 3 of the lever pull handle 1, when the lever pull handle is vertical, i.e., in the locked position. There are connecting contacts 19 extending from the rear face of the switching element, which can be connected to a part of a circuit located on the printed circuit board. Such a part of the circuit can be used to correctly interrupt the functions of a main circuit arranged on the printed circuit board. This has the advantage that the electrical functions of the printed circuit board can be ended correctly already when the lever pull handle is unlocked, i.e., before the printed circuit board is actually levered out of the mounting rack. The actual levering out is accomplished by further operation of the lever pull handles, which causes all the plug-in contacts between the printed circuit board and the mounting rack to be positively interrupted.

Figure 7:
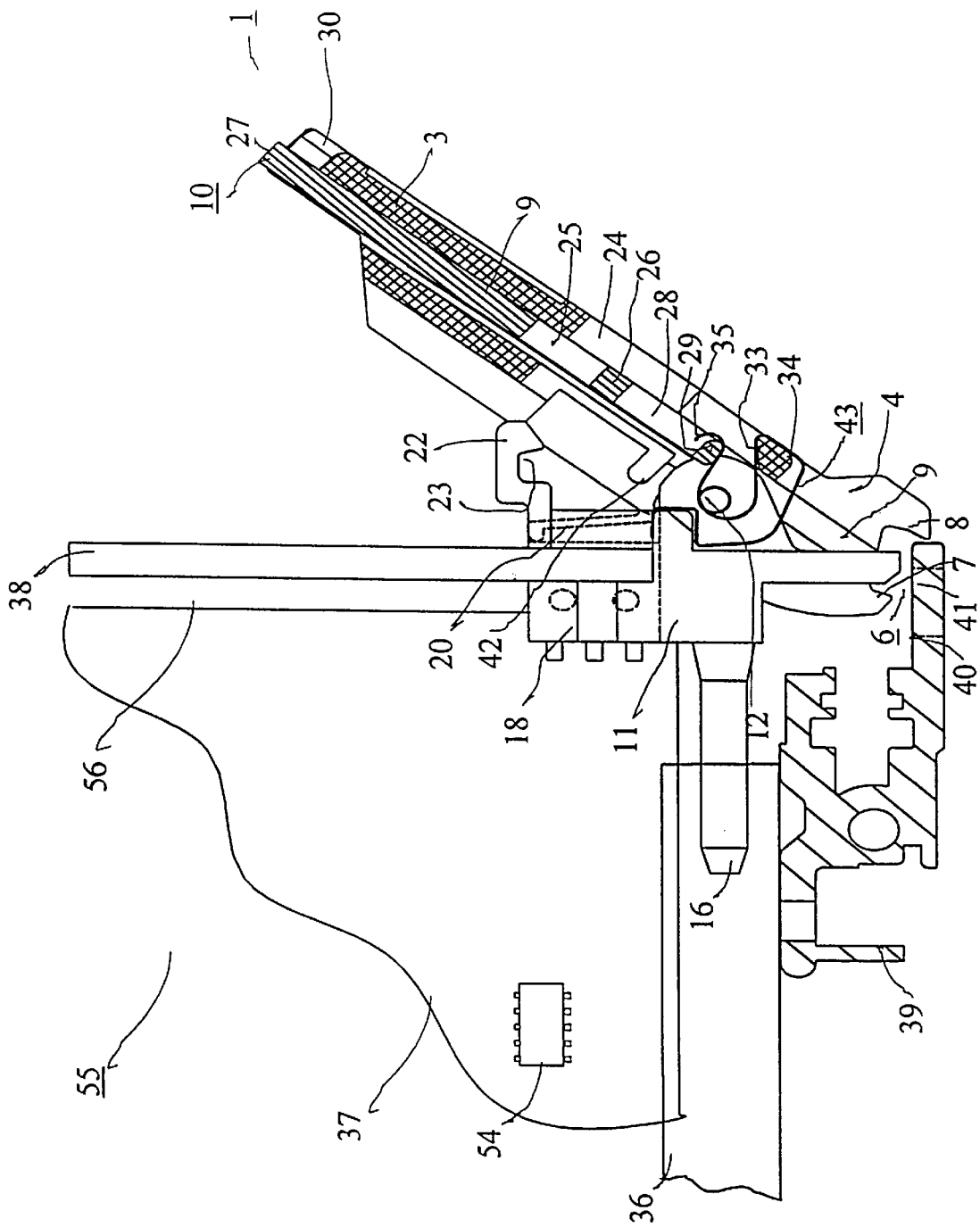
FIG. 7 shows a section illustration through a lever pull handle as shown in FIG. 5, which is fitted to the lower end of the front system of a printed circuit board, and in which the lever pull handle is in an unlocked position, such that the printed circuit board is in a state where it has been pushed out of the mounting rack.

The front system according to the invention is particularly suitable for front elements in which the switching element 18 functions essentially as a limit switch. This will be explained in more detail with the aid of FIGS. 5, 6 and 7. FIG. 5 shows a section illustration through a lever pull handle 1 which is fitted to the lower end of the front system 38, 11 of a printed circuit board 37, in which the lever pull handle 1 is in a locked position and the printed circuit board 37 is still in a state where it is completely inserted in the mounting rack 55. In contrast, FIG. 6 shows a state in which the lever pull handle 1 is in an unlocked position, but the printed circuit board 37 is still in a state where it is completely inserted in the mounting rack 55. Finally, FIG. 7 shows a state in which the lever pull handle 1 is in the unlocked position and the printed circuit board 37 has been pushed out of the mounting rack 55.

The section illustration in FIG. 5 shows, by way of example, the lower transverse rail 39 of a rail pair comprising a lower and an upper transverse rail of a mounting rack 55. An electrical printed circuit board 37 is fitted with an electrical component 54 (illustrated by way of example) and is provided, on its outwardly pointing end face 56 with a front element. This front element preferably has a front panel 38 and lower and upper corner pieces, with the lower corner piece 11 being illustrated in FIG. 1, by way of example. In the illustrated embodiment, the lower corner piece 11 is fitted to the lower, front corner of the printed circuit board 37. The front panel 38 and the lever pull handle 1 are likewise mounted on the lower corner piece. As a rule, a further lever pull handle, which is not illustrated in the figures, is fitted to the upper corner piece of the front element. The printed circuit board 37 is preferably arranged vertically in the mounting rack 55, via its lower and upper edges, in a mutually opposite pair of guide rails. In this case, the detail in FIG. 5 shows the lower guide rail 36, by way of example. The lever pull handle 1 can be used to push the printed circuit board into the mounting rack, and to push it out again.

In FIG. 5, the lever pull handle 1 is in the locked position and is thus vertical, resting as close as possible against the end face 56 of the printed circuit board and the front panel 38. Since the printed circuit board has been completely inserted in the mounting rack 55, the function of the electrical circuit located on it must be enabled. To this end, the lever pull handle 1 engages the switching bracket 20 of the switching element 18, preferably via a projecting switching contact 42, such that this switching element 18 is in the switching state that enables the circuit. As already explained, the lever pull handle 1 is held in the illustrated, locked position by the engagement of the latching tab 22 on the latching slide 10.

If the printed circuit board is now intended to be removed from the mounting rack, for example for test purposes, then the lever pull handle 1 must first be unlocked. As already explained above, to do this, an operator must exert a pushing force which is directed toward the engagement region 6 of the lever pull handle and against the pre-stress of the stressing mechanism onto the pushing edge 27 of the latching slide 10, such that the latching slide 10 moves out of the engagement region of the latching tab 22. If the stressing mechanism (which is designed, preferably, in the form of a spiral spring) has a second stressing curve, then the lever pull handle automatically pivots out of the locked position and assumes the position shown in FIG. 6. This forward pivoting, on the one hand, changes the engagement region 6 to the active state, in which the levering-out edge 8 rests against the end face of the supporting strip 40. On the other hand, the depressive force on the switching bracket 20 of the switching element 18 is relieved, so that the switching element assumes the other, i.e., inactive, switch state. As a rule, this is used to end the electrical functions on the printed circuit board correctly.

If it is now intended to lever the printed circuit board out completely, then, in the position shown in FIG. 6, an adequately large force must now be exerted on the handle region 2 of the lever pull handle. Since this handle region 2 is angled away from the front panel 38, it can be easily reached by an operator's hand. The levering-out edge 8 is supported on the lower transverse rail 39, so that the printed circuit board is pulled out of the plug connectors (which are not illustrated) and then assumes, for example, the position shown in FIG. 7. The lever pull handle 1 is now completely pivoted away forward, since the elements of its engagement region 6 make no contact with the engagement openings 41 in the lower transverse rail 39. The printed circuit board 37 can now be pulled completely out of the guide rail 36, and can be removed from the mounting rack 55.

The advantages of the front system according to the invention can be seen particularly clearly from the movement sequence shown in FIGS. 5, 6 and 7, which occurs when a printed circuit board is being levered out. These advantages include, in particular, that the respective forces that need to be applied to the lever pull handle, on the one hand to unlock the lever pull handle and on the other hand to lever the printed circuit board out, and the movement sequences which result from these forces are separated from one another. As a result, an inadvertent, virtually smooth transition between the two processes is reliably prevented.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. Front system for electrical printed circuit boards supported in a mounting rack via opposing pairs of adjacently arranged guide rails, comprising:

a) a front element fitted on a front end face of a printed circuit board;

b) lever pull handles fitted respectively to an upper corner and to a lower corner of said front element, each of said lever pull handles being mounted pivotably about a fulcrum in a plane of the printed circuit board and having an engagement region on an end facing a respective corner of said front element, wherein the engagement region is supported on the mounting rack when the printed circuit board is levered into or out of the mounting rack;

c) a latching slide mounted in each of said lever pull handles, each of said latching slides having a pushing region at an end of said respective lever pull handle that is located opposite the engagement region;

d) stressing mechanisms, each of which, respectively, exerts a pre-stress, directed toward the pushing region, on said latching slide and holds said latching slide in an original position; and e) latching mechanisms arranged at the upper corner and the lower corner, respectively, of said front element, each of said latching mechanisms engaging on said latching slide, said stressing mechanism and said front element, wherein said lever pull handles are held in locked positions when each said lever pull handle is pivoted toward said front element of the printed circuit board, and wherein said latching mechanisms each are unlocked by a force on said latching slide which is exerted on the pushing region of said latching slide and is directed in a direction opposing the pre-stress of said stressing mechanism.

2. The front system as claimed in claim 1, wherein, in the locked positions of said lever pull handles, each said lever pull handle rests against said front element.

3. The front system as claimed in claim 1, wherein:

each of said latching mechanisms comprises a latching hook, and the pre-stress exerted by each of said stressing mechanisms on each said latching slide causes each said latching slide to engage said front element such that each said lever pull handle is held in the locked position.

4. The front system as claimed in claim 1, wherein:

a) said front element comprises a front panel and end pieces respectively at an upper end and a lower end of the front panel, said end pieces connecting said front panel to the printed circuit board, and b) said latching mechanisms are connected to said end pieces respectively at the upper and lower ends of said front panel.

5. The front system as claimed in claim 4, wherein each of said latching slides comprises:

at least one through-opening receiving said latching mechanism, and a wall region engaging with said latching mechanism under the pre-stress exerted by said stressing mechanism on said latching slide.

6. The front system as claimed in claim 1, wherein each of said lever pull handles comprises a handle recess exposing the pushing region of said latching slide located at the end of said lever pull handle that is opposite the engagement region.

7. The front system as claimed in claim 6, wherein the recess defines an arcuate section.

8. The front system as claimed in claim 1, wherein:

a) each of said stressing mechanisms comprises a spiral spring that includes at least a first stressing curve exerting the pre-stress directed toward the pushing region, and b) the first stressing curve is supported on said front element.

9. The front system as claimed in claim 8, wherein:

a) said spiral spring includes a second stressing curve connected to the first stressing curve, and b) the second stressing curve exerts a further pre-stress on said lever pull handle directed to cause said lever pull handle to pivot away from said front element when said latching element is unlocked.

10. The front system as claimed in claim 1, wherein:

a) said front element comprises an electrical switching element integrated into said front element, and b) said switching element is in one switching state when said latching mechanism is in a locked state, and said switching element is in another switching state when said latching mechanism is in an unlocked state.

11. The front system as claimed in claim 1, wherein, when each of said latching mechanisms is in a locked state, each of said respective lever pull handles is fitted to said front element in such a manner that said lever pull handle extends at least substantially parallel to said front element and rests against said front element.

12. The front system as claimed in claim 11, wherein:

each of said lever pull handles comprises at least one longitudinally extending, long lever arm configured to mount said respective latching slide, and the pushing region of said latching slide is located at an end of said lever arm that is opposite the engagement region.

13. Front system, comprising:

a front element including a latch;

a lever pull handle pivotably mounted with respect to said front element, said lever pull handle pivoting between a locked position and a levered-out position;

wherein said lever pull handle comprises:

a lever body; and a latching slide slidably mounted with respect to said lever body, said latching slide sliding between a latched position, in which said latching slide engages said latch, and an unlatched position, in which said latching slide fails to engage said latch; and a resilient member exerting a force pressing said latching slide into the latched position.

14. The front system according to claim 13, wherein said resilient member is mounted between said latching slide and said lever body.

15. The front system according to claim 13, wherein said resilient member is mounted between said latching slide and said front element.

16. The front system according to claim 13, wherein said latching slide slides along a longitudinal axis of said lever body.

17. The front system according to claim 13, wherein said resilient member additionally exerts a force pressing said lever pull handle into an unlocked position that is intermediate between the locked position and the levered-out position.

* * * * *